United States Patent
Yang et al.

(10) Patent No.: US 9,613,854 B2
(45) Date of Patent: Apr. 4, 2017

(54) METHOD AND APPARATUS FOR BACK END OF LINE SEMICONDUCTOR DEVICE PROCESSING

(71) Applicant: Taiwan Semiconductor Manufacturing Company, Ltd., Hsin-Chu (TW)

(72) Inventors: Shin-Yi Yang, New Taipei (TW); Hsiang-Huan Lee, Jhudong Township (TW); Ming-Han Lee, Taipei (TW); Ching-Fu Yeh, Hsin-Chu (TW); Pei-Yin Liou, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/853,104

(22) Filed: Sep. 14, 2015

(65) Prior Publication Data

US 2016/0005648 A1 Jan. 7, 2016

Related U.S. Application Data

(63) Continuation of application No. 13/920,861, filed on Jun. 18, 2013, now Pat. No. 9,142,505.

(51) Int. Cl.
*H01L 21/44* (2006.01)
*H01L 21/768* (2006.01)
(Continued)

(52) U.S. Cl.
CPC .. *H01L 21/76847* (2013.01); *H01L 21/76829* (2013.01); *H01L 21/76831* (2013.01); *H01L 21/76843* (2013.01); *H01L 21/76849* (2013.01); *H01L 23/5226* (2013.01); *H01L 23/5329* (2013.01); *H01L 23/53276* (2013.01); *H01L 23/53295* (2013.01); *H01L 23/53223* (2013.01);
(Continued)

(58) Field of Classification Search
CPC ......... H01L 21/76847; H01L 21/76829; H01L 21/76831
See application file for complete search history.

(56) References Cited

U.S. PATENT DOCUMENTS 7,473,633 B2 * 1/2009 Furukawa .............. B82Y 10/00
257/E21.171
8,361,813 B1 1/2013 Niyogi et al.
(Continued)

OTHER PUBLICATIONS

Bhaviripudi, S., et al., •Role of Kinetic Factors in Chemical Vapor Deposition Systhesis of Uniform Large Area Graphene Using Copper Catalyst,• NANO Letters 2010, Issue 10, pp. 4128-4133.
(Continued)

*Primary Examiner* — Marc Armand
*Assistant Examiner* — Sarah Salerno
(74) *Attorney, Agent, or Firm* — Slater Matsil, LLP

(57) ABSTRACT

A method of forming a device may include: forming an opening through a dielectric layer and an underlying etching stop layer to expose a metal line. The method may further include the step of catalytically growing a graphene layer on an exposed surface of the metal line, and depositing an amorphous carbon layer on sidewalls of the opening. The steps of catalytically growing the graphene layer and depositing the amorphous carbon layer may be performed simultaneously.

20 Claims, 4 Drawing Sheets

(51) Int. Cl.
*H01L 23/522* (2006.01)
*H01L 23/532* (2006.01)

(52) U.S. Cl.
CPC .. *H01L 23/53238* (2013.01); *H01L 23/53252* (2013.01); *H01L 2924/0002* (2013.01)

(56) References Cited

U.S. PATENT DOCUMENTS

2005/0001318 A1* 1/2005 Won .................. H01L 23/53238
257/751
2009/0257270 A1* 10/2009 Schricker ................ H01L 45/04
365/148
2011/0006425 A1 1/2011 Wada et al.
2012/0261647 A1 10/2012 Marsh et al.

OTHER PUBLICATIONS

Zheng, M., et al., "Metal-catalyzed crystallization of amorphous carbon to graphene," Applied Physics Letters 96, No. 6, 2010, pp. 063110-063110.

* cited by examiner

METHOD AND APPARATUS FOR BACK END OF LINE SEMICONDUCTOR DEVICE PROCESSING

PRIORITY CLAIM AND CROSS-REFERENCE

The present application claims priority to and is a continuation of U.S. patent application Ser. No. 13/920,861, filed on Jun. 18, 2013, and entitled "Method and Apparatus for Back End of Line Semiconductor Device Processing," which application is incorporated herein in its entirety by reference.

BACKGROUND

Generally, integrated circuits (ICs) comprise individual devices, such as transistors, capacitors, or the like, formed on a substrate. One or more metal layers are then formed over the individual devices to provide connections between the individual devices and to provide connections to external devices. The front-end-of-line (FEOL) is the first portion of IC fabrication where the individual devices (transistors, capacitors, resistors, etc.) are patterned in a wafer. FEOL generally covers everything up to (but not including) the deposition of metal layers. The back end of line (BEOL) is the second portion of IC fabrication where the individual devices get interconnected with wiring or metal layers on the wafer. BEOL generally begins when the first metal layer is deposited on the wafer. It includes contacts, insulating layers, metal layers, and bonding sites for chip-to-package connections.

The metal layers interconnecting individual devices typically comprise an inter-metal dielectric (IMD) layer in which interconnect structures, such as vias and conductive lines, are formed, through numerous and repetitive steps of deposition, patterning and etching of thin films on the surface of silicon wafer. While aluminum and aluminum alloys were most frequently used in the past for the metal layers, the current trend is to use copper (Cu) for metal layers because copper has better electrical characteristics than aluminum, such as decreased resistance, higher conductivity, and a higher melting point.

Barrier layers are used to prevent diffusion of the conductor materials of the metal layers, such as the aluminum or Cu, into the adjacent areas of the IC. As the interconnect line widths shrink continuously, how to fabricate the barrier layers with ultra thin, conformal coatings and excellent conductivities is an important issue to resolve and needs new methods and apparatus.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Figure 1:
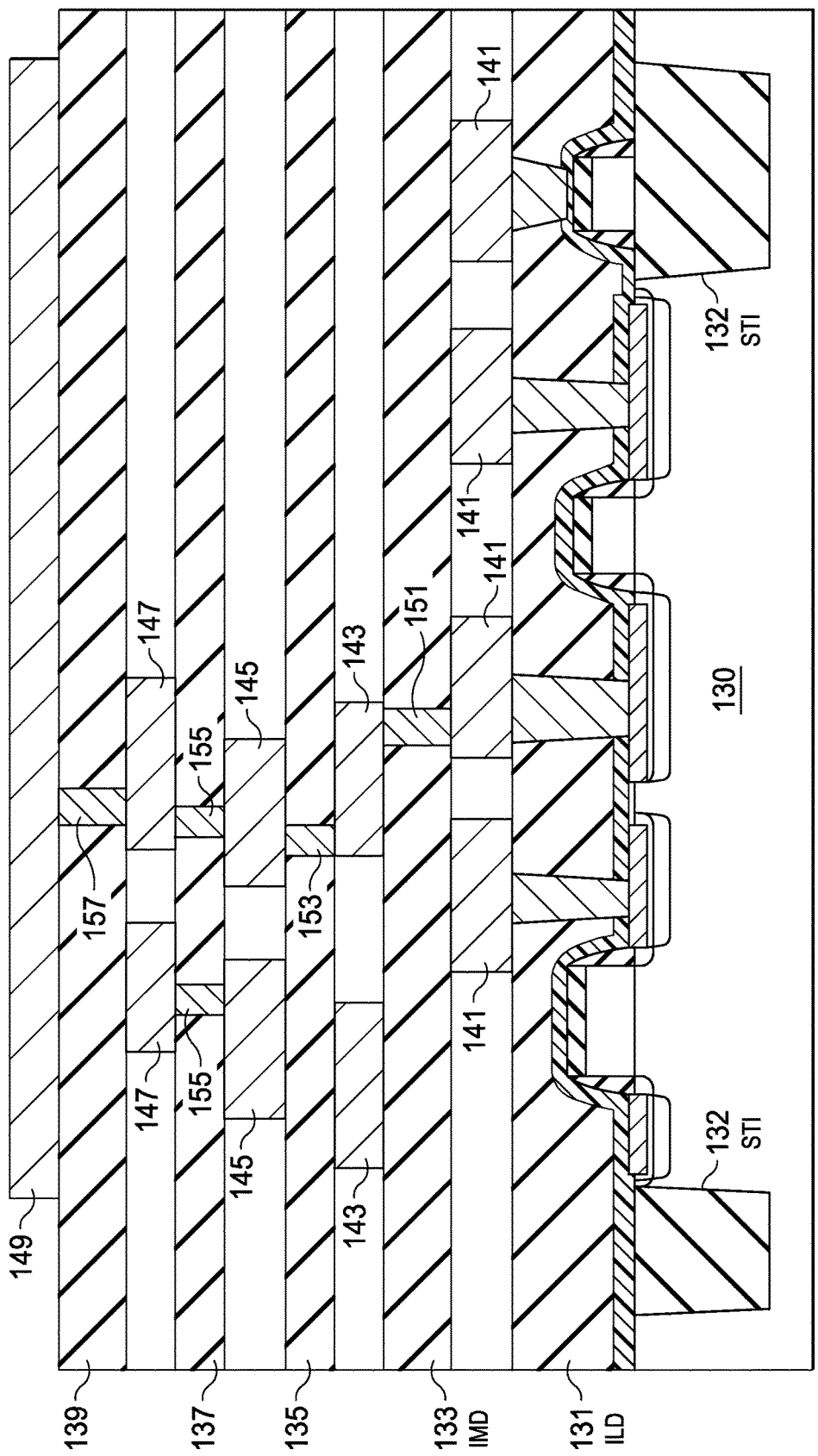
FIG. 1 illustrates in a cross sectional view various metal layers formed on individual devices of an integrated circuit (IC), in accordance with an embodiment.

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

Methods and apparatus are disclosed for the back end of line process for fabrication of integrated circuits (ICs). A barrier layer comprising a bottom part and a side part may be formed within an opening for a metal contact, wherein the bottom part of the barrier layer comprises a graphene material and in contact with a conductive line below the opening, the side part of the barrier layer comprises an amorphous carbon material and covers a sidewall of the opening, and the bottom part and the side part are formed at a same time. A capping layer comprising a first part and a second part may be formed on a dielectric layer and a metal contact, wherein the first part of the capping layer comprises a graphene material on the metal contact and in contact with the metal contact, the second part of the capping layer comprises an amorphous carbon material on the dielectric layer, and the first part and the second part of the capping layer are formed at a same time. The bottom part and the side part of the barrier layer may be formed at the same time by a selective chemical vapor deposition (CVD) growth method. The first part and the second part of the capping layer may be formed at the same time by a selective chemical vapor deposition (CVD) growth method.

It will be understood that when an element or layer is referred to as being "on," "connected to" or "coupled to" another element or layer, it can be directly on, or connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" or "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising,"—when used in this specification, specify the presence of stated features, integers, steps, operations, elements, and/or components, but do not preclude the presence or addition of one or more other features, integers, steps, operations, elements, components, and/or groups thereof.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIG. 1 is an illustrative integrated circuit (IC) comprising individual devices, such as transistors, capacitors, or the like, formed on a substrate 130. One or more metal layers 141, 143, 145, 147, and 149 are then formed over the individual devices to provide connections among the individual devices and to provide connections to external devices. On top of the substrate layer 130 is an inter-layer dielectric (ILD) layer 131 between a first metal layer 141 and the substrate layer 130. On top of the ILD layer 131 is the first metal layer 141, where a plurality of metal contacts are located and connected to the devices within the substrate layer 130 by vias through the ILD layer 131. The first metal layer 141 may be called the metal layer $M_1$. A second metal layer 143, which may be called the metal layer $M_2$, is located on top of the first metal layer 141 separated by an inter-metal dielectric (IMD) layer 133. Similarly, additional metal layers 145, 147, and 149 are formed on top of each other and separated by IMD layers 135, 137, and 139 respectively. Metal contacts between different metal layers are connected by vias such as via 151, 153, 155, and 157. The number of metal layers 141 to 149 and the number of vias 151 to 157 connecting the metal layers are only for illustrative purposes and are not limiting. There could be other number of layers that is more or less than the 5 metal layers shown in FIG. 1.

The substrate layer 130 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The substrate 130 may comprise electrical devices such as transistors, capacitors, resistors, diodes, photo-diodes, fuses, and the like, interconnected to perform one or more functions. The functions may include memory structures, processing structures, sensors, amplifiers, power distribution, input/output circuitry, or the like.

Shallow trench isolations (STIs) 132, or other isolation structures, may be formed in substrate 130 to isolate device regions. STIs 132 may be formed by etching substrate 130 using photolithography techniques to form recesses. Generally, photolithography involves depositing a photoresist material, which is then masked, exposed, and developed. After the photoresist mask is patterned, an etching process may be performed to remove unwanted portions of the substrate 130. The recesses are then filled with a dielectric material such as an oxide layer formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. A planarization step may be performed to planarize the surface of the isolation material with a top surface of the substrate 130. The planarization step may be accomplished, for example, using a chemical mechanical polishing (CMP) process known and used in the art.

An ILD layer 131 is formed over the substrate 130. The ILD layer 131 may comprise a low dielectric constant or an extreme low dielectric constant material. For example, the ILD layer 131 may comprise an oxide, $SiO_2$, borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS). A planarization process, such as a CMP process, may be performed to planarize the ILD layer 131.

The process forming the individual devices such as transistors, capacitors, resistors, diodes, photo-diodes, fuses, STIs, and the like, within the substrate 130 and the ILD layer 131 may be collectively referred as the front-end-of-line (FEOL) process, which is the first portion of IC fabrication where the individual devices (transistors, capacitors, resistors, etc.) are patterned in a wafer. FEOL generally covers everything up to (but not including) the deposition of metal layers.

Following the FEOL process is the back end of line (BEOL) process, which is the second portion of IC fabrication where the individual devices are interconnected with wiring or metal layers 141 to 149 on the IC as shown in FIG. 1. The BEOL process generally begins when the first metal layer 141 is deposited on the wafer. It includes contacts, insulating layers, metal layers, and bonding sites for chip-to-package connections. As the result, the metal layers 141 to 149 as illustrated in FIG. 1, or one or more metal layers in general, may be formed over the ILD layer 131. A typical IC may comprise three or more metal layers, followed by a final passivation layer, not shown in FIG. 1. The final passivation layer may be used for protecting the IC from mechanical abrasion during probe and packaging and to provide a barrier to contaminants. After the final passivation layer, the bond pads for input/output will be opened, followed by the normal post-fabrication process such as wafer probe, die separation, and packaging.

In more details, the BEOL process may comprise a sequence of steps: adding a metal layer $M_i$, adding an intra-metal dielectric (IMD) layer, making vias through the IMD layer to connect to lower metal layer contacts, and forming higher metal layer contacts connected to the vias, or creating vias and conductive lines of a higher metal layer by etching via holes and trenches for the conductive lines at the same time. The IMD layer may comprise various layers such as an etching stop layer, a dielectric layer, a barrier layer, and a capping layer, which will be shown in more details in FIGS. 2(a)-2(h).

The metal layers 141 to 149 as illustrated in FIG. 1, may be formed of any suitable conductive material, such as a highly-conductive metal, low-resistive metal, elemental metal, transition metal, or the like. In an embodiment the metal layers may be formed of copper, although other materials, such as tungsten, aluminum, gold, or the like, could alternatively be utilized. Copper has a more desirable thermal conductivity and is available in a highly pure state. In an embodiment in which the metal layers are formed of copper, the metal layers may be deposited by electroplating techniques, although any method of formation could alternatively be used.

The metal layers 141 to 149 shown in FIG. 1 are separated by IMD layers 133 to 139. The IMD layers 133 to 139 may comprise multiple sub-layers. The IMD layers 133 to 139 may comprise a low dielectric constant or an extreme low dielectric constant (ELK) material, such as an oxide, $SiO_2$, borophosphosilicate glass (BPSG), TEOS, spin on glass (SOG), undoped silicate glass (USG), fluorinated silicate glass (FSG), high-density plasma (HDP) oxide, or plasma-enhanced TEOS (PETEOS). A planarization process, such as a chemical-mechanical polish (CMP) process, may be performed to planarize the various IMD layers.

FIGS. 2(a)-2(h) illustrate in cross sectional views a method of a back end of line (BEOL) processing for fabricating an IC where a barrier layer and a capping layer are made, in accordance with an embodiment.

Figure 2A:
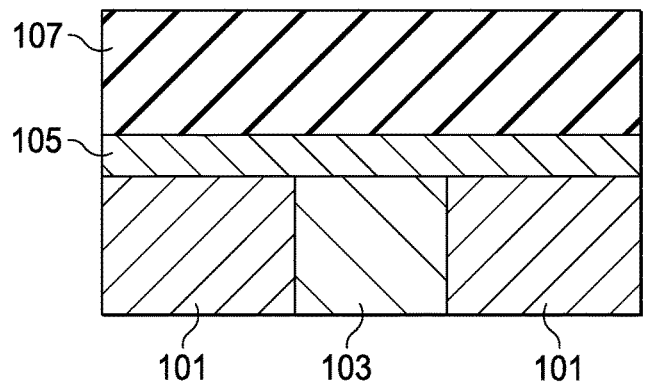
FIGS. 2(a)-2(h) illustrate in cross sectional views a method of a back end of line (BEOL) processing for fabricating an IC where a barrier layer and a capping layer are made, in accordance with an embodiment.

As illustrated in FIG. 2(a), a metal layer 101 is shown as a bottom layer. The metal layer 101 may be any of the metal layers 141 to 149 shown in FIG. 1, which may be or may not be the first metal layer above the ILD layer 131. The conductive line 103 is formed within the metal layer 101. The conductive line 103 may be formed of copper, although other materials, such as tungsten, aluminum, gold, or the like, could alternatively be utilized. In an embodiment in which the conductive line 103 is formed of copper, the conductive line 103 may be deposited by electroplating techniques, although any method of formation could alternatively be used.

An etching stop layer 105 may be formed on the metal layer 101. In addition to signaling the termination point of an etching process, the etching stop layer 105 protects any underlying layer or layers during the etching process. The etching stop layer 105 may comprise a plurality of layers. Materials for the etching stop layer 105 may include SiC, SiN, TEOS, hard black diamond (HBD), or the like. Alternatively, the etching stop layer 105 may be formed by depositing and annealing a metal oxide material, which may include hafnium, hafnium oxide (HfO2), or aluminum.

A dielectric layer 107 may be formed on the etching stop layer 105. The dielectric layer 107 may be deposited by methods including CVD, plasma enhanced chemical vapor deposition (PECVD), high density plasma chemical vapor deposition (HDP-CVD) and atmospheric pressure chemical vapor deposition (APCVD). The dielectric layer 107 may comprise a material, such as an oxide, $SiO_2$, borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS). The dielectric layer 107 may have a thickness of from about 300 to about 1200 angstroms.

Figure 2B:
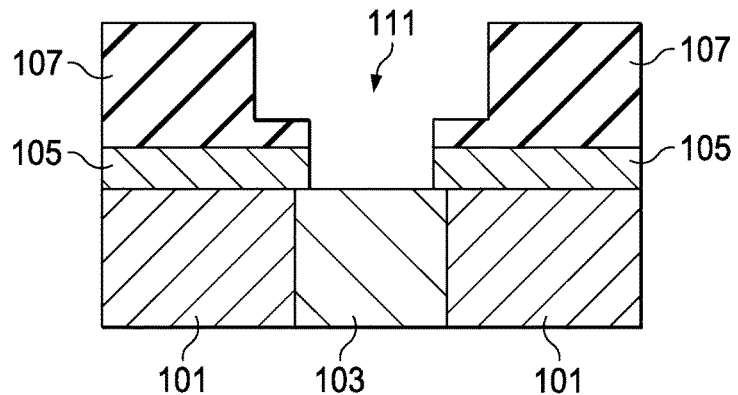

As illustrated in FIG. 2(b), an opening 111 is formed through the etching stop layer 105 and the dielectric layer 107 to expose the conductive line 103 in the metal layer 101. The opening 111 comprises a dielectric part of the opening 111 within the dielectric layer 107 and an etching stop layer part of the opening 111 within the etching stop layer 105.

The dielectric part of the opening 111 and the etching stop layer part of the opening 111 may be of a same shape and size. Alternatively, dielectric part of the opening 111 and the etching stop layer part of the opening 111 may be of a different shape and size. As illustrated in FIG. 2(b) in a cross-sectional view, the dielectric part of the opening 111 and the etching stop layer part of the opening 111 may be of a rectangle shape, and the dielectric part of the opening 111 may have a wider width than the etching stop layer part of the opening 111 has.

Figure 2C:
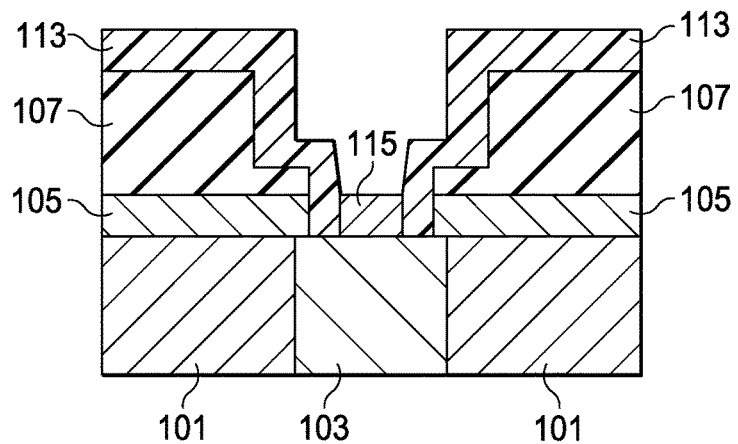

As illustrated in FIG. 2(c), a barrier layer comprising a bottom part 115 and a side part 113 is formed covering the dielectric layer 107 and the first opening 111. The opening 111 will be filled by a conductive material to form a metal contact. The conductive material filling the opening 111 may be made of a conductor material such as copper. Due to the high mobility of copper atoms, it is possible for copper diffusion into the dielectric layer 107 and further into other areas of the IC. This diffusion can cause short circuits to the IC which can result in failure of the IC. The barrier layer comprising the bottom part 115 and the side part 113 can stop the diffusion of the conductive material filling the opening 111.

The bottom part 115 of the barrier layer may comprise a graphene material and cover a bottom of the opening 111 and in contact with the conductive line 103, while the side part 113 of the barrier layer may comprise an amorphous carbon material and cover a sidewall of the opening 111 and in contact with the dielectric layer 107 and the etching stop layer 105. The side part 113 may also extend over the surface of the dielectric layer 107. The bottom part 115 and the side part 113 may be formed at a same time. In an embodiment, the bottom part 115 and the side part 113 are formed at the same time by a selective chemical vapor deposition (CVD) growth method.

A graphene material made up of the bottom part 115 is a two-dimensional material composed of carbon atoms arranged in a hexagonal atomic structure. Its extended honeycomb network is the basic building block of other important allotropes. Graphene possesses many unique and novel properties, such as inherent high surface area (~2630 $m^2/g$), superior conductivity (20000 S/cm), electromagnetic immunity, and physical stability. The amorphous carbon material made up of the side part 113 is the free carbon with amorphous carbon-solid or some short-range polycrystalline structure, which mainly consists of sp3-bonds, which possesses low conductivity and can act as a barrier layer.

A graphene layer can be synthesized via metal-catalyzed crystallization of amorphous carbon. The amorphous carbon material is deposited though the opening 111 so that the barrier layer with the bottom part 113 comprising the graphene material and the side part 115 comprising the amorphous carbon material can be made at a same time. The graphene can grow on the surface of a catalyst-layer, which induce the selective-growth of graphene layer. The specific metal (such as Cu, Fe, Co Ni) of the conductive line 103 can act as the catalyst for graphene-growth to form the bottom part 115. By contrast, the amorphous carbon formed on the sidewalls possesses low conductivity and act as the side part 113 of the barrier layer.

Graphene may be produced by chemical reduction of graphite oxide, high temperature annealing of single crystal SiC, or Chemical Vapor Deposition (CVD) on the surface of a catalyst-layer. Detailed methods of producing graphene using amorphous carbon can be found in "Metal-catalyzed crystallization of amorphous carbon to graphene," by Zheng, et. al., Applied Physics Letters, 96, 063110 (2010), or "Role of Kinetic Factors in Chemical Vapor Deposition Synthesis of Uniform Large Area Graphene Using Copper Catalyst," by Bhaviripudi, et al., Nano Letter, 2010, 10, 4128-4133. CVD is a technique of thin solid film deposition on substrates from the vapor species through chemical reactions. The chemical reaction plays an important role and is thus one of the most distinctive features that CVD possesses compared with other film deposition techniques such as physical vapor deposition (PVD). A typical tube-furnace CVD system for graphene growth may comprise a gas delivery system, a reactor and a gas removal system. During the CVD process, reactive gas species are fed into the reactor by the gas delivery system through valves. A gas-mixing unit may mix the various gases uniformly before they are let in the reactor. The reactor is where the chemical reaction takes place and the solid materials are deposited on substrates as the purpose of the reaction. The heaters are placed surrounding the reactor to provide high temperatures for the reaction. Eventually the by-products of the reaction and non-reacted gases are removed by the gas removal system. The graphene can grow on the surface of conductive line 103, which acts as a catalyst-layer to induce the selective-growth of graphene layer to form the bottom part 115. The thickness of the bottom part 115 can be controlled by processing conditions, such as temperature, time, concentration. The range of thickness for the bottom part 115 may be from about 1 A to about 50 A.

Figure 2D:
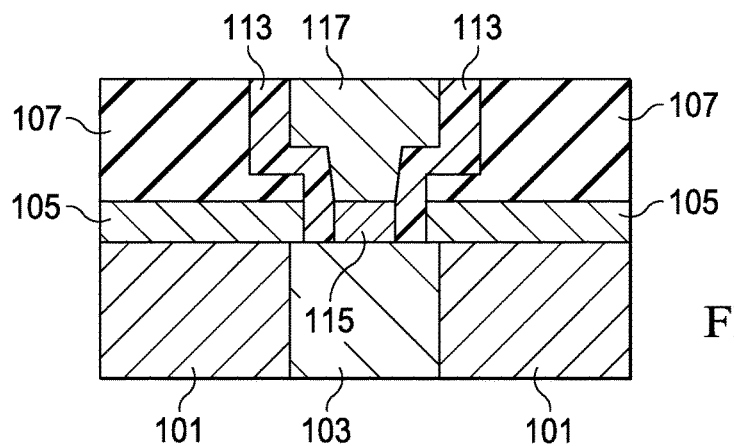

As illustrated in FIG. 2(d), the excessive side part 113 on the dielectric layer 107 may be removed, and a planarization process, such as a chemical-mechanical polish (CMP) process, may be performed to planarize the side part 113 to be coplanar surface as the dielectric layer 107. Afterwards, a metal contact 117 may be formed filling the first opening 111. The metal contact 117 is in contact with the bottom part 115 of the barrier layer and with the side part 113 of the barrier layer. The bottom part 115 of the barrier layer may be made of the graphene material which has superior conductivity. Therefore the metal contact 117 is electrically connected to the conductive line 103. The side part 113 of the barrier layer has low conductivity and can act as a barrier layer, to stop the diffusion of the metal contact 117 to the surrounding areas.

Figure 2E:
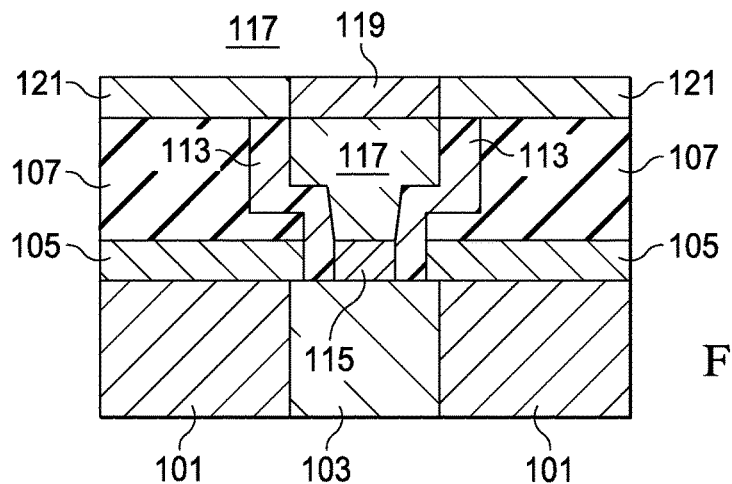

As illustrated in FIG. 2(e), a capping layer comprising a first part 119 and a second part 121 may be formed on the metal contact 117 and the dielectric layer 107. The first part 119 of the capping layer comprises a graphene material on the metal contact 117 and in contact with the metal contact 117. The second part 121 of the capping layer comprises an amorphous carbon material on the dielectric layer 107. Similarly as forming the barrier layer, the first part 119 and the second part 121 of the capping layer may be formed at a same time. In an embodiment, the first part 119 and the second part 121 of the capping layer may be formed at the same time by a selective CVD growth method.

Figure 2F:
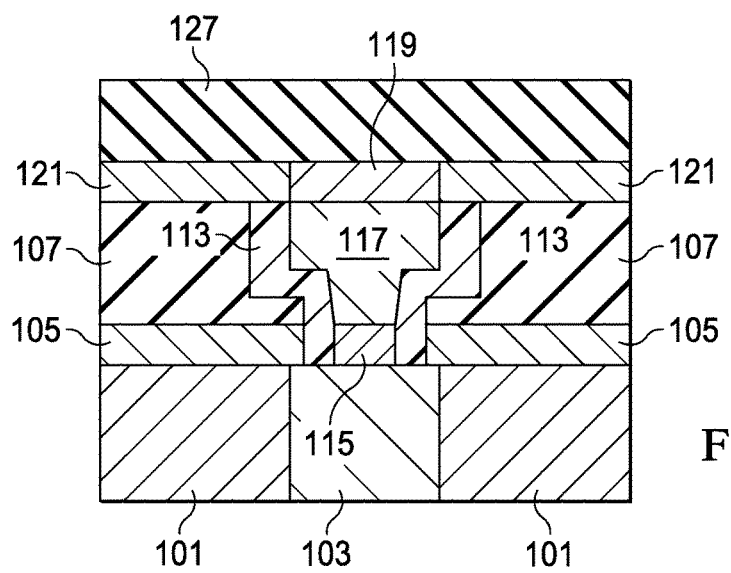

As illustrated in FIG. 2(f), a second dielectric layer 127 may be formed on the capping layer, covering the first part 119 and the second part 121. The second dielectric layer 127 may be deposited by methods including CVD, plasma enhanced chemical vapor deposition (PECVD), high density plasma chemical vapor deposition (HDP-CVD) and atmospheric pressure chemical vapor deposition (APCVD). The second dielectric layer 127 may comprise a material, such as an oxide, $SiO_2$, borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS). The second dielectric layer 127 may have a thickness of from about 300 to about 1200 angstroms.

Figure 2G:
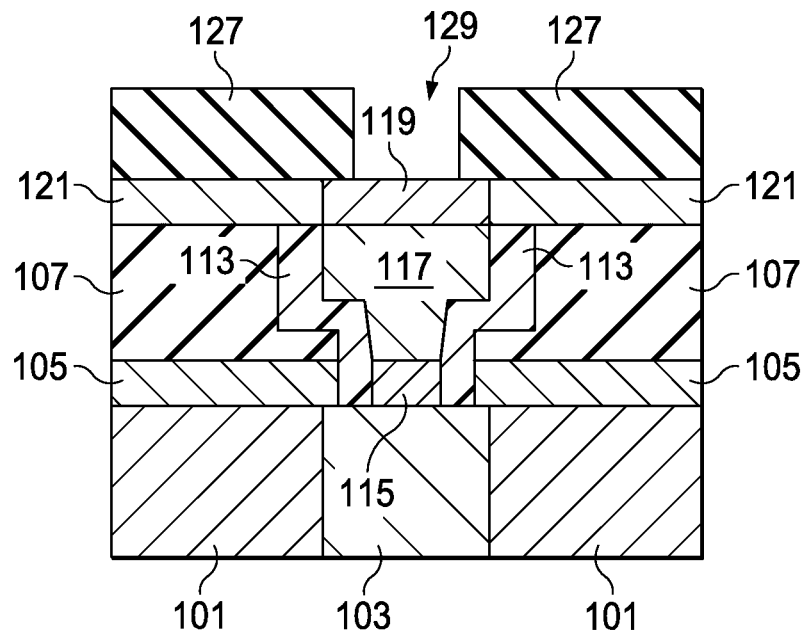

As illustrated in FIG. 2(g), a second opening 129 may be formed within the second dielectric layer 127, to expose the first part 119 of the capping layer. The second opening 129 may be formed by etching the second dielectric layer 127 using photolithography techniques. A photoresist material may be deposited on the second dielectric layer 127, which is then masked, exposed, and developed. After the photoresist mask is patterned, an etching process may be performed to remove unwanted portions of the second dielectric layer 127 to form the second opening 129.

Figure 2H:
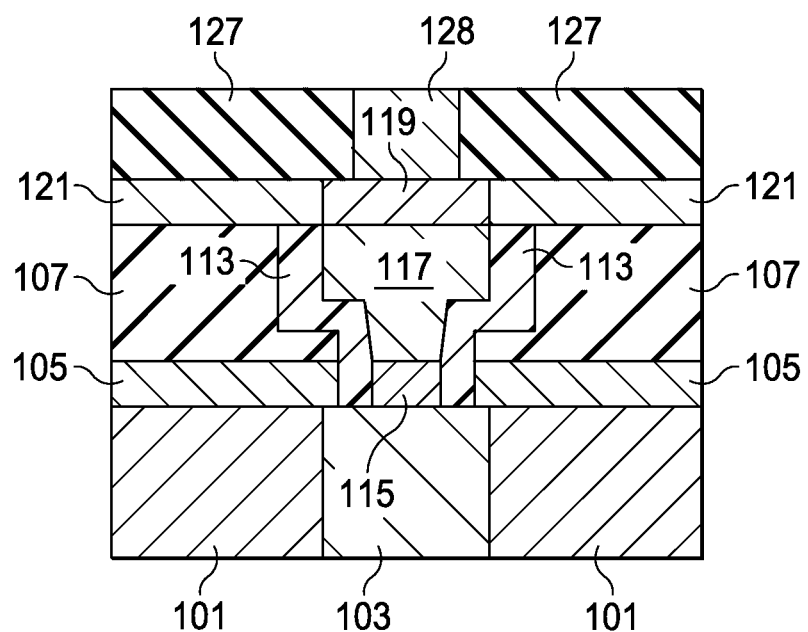

As shown in FIG. 2(h), a via 128 may be formed within the second opening 129 wherein the via is in contact with the first part of the capping layer. The via 128 may comprise a conductive material such as copper, although other materials, such as tungsten, aluminum, gold, or the like, could alternatively be utilized. In an embodiment in which the via 128 is formed of copper, the via 128 may be deposited by electroplating techniques, although any method of formation could alternatively be used. Further conductive lines may be formed on the via 128 at an upper metal layer, which is not shown.

A method is disclosed for the back end of line process for fabrication of integrated circuits (ICs). An etching stop layer is formed on a metal layer. A dielectric layer is formed on the etching stop layer. An opening is formed through the etching stop layer and the dielectric layer to expose a conductive line in the metal layer. A barrier layer is formed, wherein the barrier layer comprises a bottom part and a side part, the bottom part of the barrier layer comprises a graphene material and covers a bottom of the opening and in contact with the conductive line, the side part of the barrier layer comprises an amorphous carbon material and covers a sidewall of the opening and in contact with the dielectric layer and the etching stop layer, and the bottom part and the side part are formed at a same time.

A device is disclosed for the fabrication of integrated circuits (ICs). The device comprises an etching stop layer on a metal layer, and a dielectric layer on the etching stop layer. An opening is formed through the etching stop layer and the dielectric layer to expose a conductive line in the metal layer. A barrier layer is formed covering the bottom and the sidewall of the opening. The barrier layer comprises a bottom part and a side part, wherein the bottom part of the barrier layer comprises a graphene material and covers a bottom of the opening and in contact with the conductive line, the side part of the barrier layer comprises an amorphous carbon material and covers a sidewall of the opening and in contact with the dielectric layer and the etching stop layer.

A method is disclosed for the back end of line process for fabrication of integrated circuits (ICs). An etching stop layer is formed on a metal layer. A dielectric layer is formed on the etching stop layer. An opening is formed through the etching stop layer and the dielectric layer to expose a conductive line in the metal layer. A barrier layer is formed, wherein the barrier layer comprises a bottom part and a side part, the bottom part of the barrier layer comprises a graphene material and covers a bottom of the opening and in contact with the conductive line, the side part of the barrier layer comprises an amorphous carbon material and covers a sidewall of the opening and in contact with the dielectric layer and the etching stop layer, and the bottom part and the side part are formed at a same time. A metal contact is formed filling the opening, wherein the metal contact is in contact with the bottom part of the barrier layer and with the side part of the barrier layer. A capping layer comprising a first part and a second part is further formed, wherein the first part of the capping layer comprises a graphene material on the metal contact and in contact with the metal contact, the second part of the capping layer comprises an amorphous carbon material and covers the dielectric layer, and the first part and the second part of the capping layer are formed at a same time.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a device, the method comprising:
   forming an opening through a dielectric layer and an underlying etching stop layer to expose a metal line;
   catalytically growing a graphene layer on an exposed surface of the metal line; and
   depositing an amorphous carbon layer on sidewalls of the opening, wherein the steps of catalytically growing the graphene layer and depositing the amorphous carbon layer are performed simultaneously.

2. The method of claim 1, wherein a portion of the amorphous carbon layer is disposed laterally adjacent to the graphene layer and the etching stop layer, the portion of the amorphous carbon layer being in physical contact with the metal line.

3. The method of claim 1, wherein a thickness of the graphene layer is in a range from about 1 Angstrom to about 50 Angstroms.

4. The method of claim 1, wherein catalytically growing the graphene layer comprises:
   depositing an amorphous carbon material over the exposed surface of the metal line, the metal line acting as a catalyst for selective-growth of the graphene layer on the exposed surface of the metal line.

5. The method of claim 1, wherein catalytically growing the graphene layer comprises a selective chemical vapor deposition (CVD) growth process.

6. The method of claim 1, further comprising:
   filling the opening with a conductive material to form a metal contact.

7. The method of claim 6, further comprising:
   forming a first capping layer over the metal contact, the first capping layer comprising graphene; and
   forming a second capping layer over the dielectric layer and laterally adjacent to the first capping layer, the second capping layer comprising amorphous carbon.

8. The method of claim 7, wherein the first capping layer and the second capping layer are formed at a same time.

9. A method of manufacturing a device, the method comprising:
   depositing a metal oxide material over a metal layer to form an etching stop layer;
   depositing a first dielectric material over the etching stop layer;
   etching a first opening through the etching stop layer and the first dielectric material to expose a surface of a conductive feature formed in the metal layer;
   lining sidewalls of the first opening with an amorphous carbon material; and
   simultaneous to the lining, forming a graphene layer at a bottom the first opening, the graphene layer contacting the conductive feature.

10. The method of claim 9, wherein the metal oxide material comprises at least one of hafnium or aluminum.

11. The method of claim 9, wherein forming the graphene layer comprises at least one of a chemical reduction of graphite oxide, an annealing of single-crystal SiC, or a chemical vapor deposition (CVD) process.

12. The method of claim 9, wherein a portion of the amorphous carbon material proximal the conductive feature contacts the conductive feature and is laterally adjacent to the etching stop layer and the graphene layer.

13. The method of claim 9, further comprising:
   forming a metal contact in the first opening and over the graphene layer;
   forming a capping layer over the metal contact and the first dielectric material, the capping layer having a first portion disposed over and contacting the metal contact;
   forming a second dielectric material over the capping layer;
   forming a second opening in the second dielectric material, the second opening exposing the first portion of the capping layer; and
   filling the second opening with a conductive material to form a via.

14. The method of claim 13, wherein the capping layer comprises a second portion disposed over and contacting the amorphous carbon material and the first dielectric material.

15. The method of claim 14, wherein no portion of the second portion of the capping layer is exposed by the second opening.

16. A method of manufacturing a device, the method comprising:
   forming an opening through a first dielectric layer to expose a surface of a conductive line in a metal layer;
   forming a first amorphous carbon layer over sidewalls of the opening and in peripheral portions of a bottom of the opening; and
   forming a first graphene layer in a central portion of the bottom of the opening, the first graphene layer physically contacting the surface of the conductive line and portions of the first amorphous carbon layer disposed in peripheral portions of the bottom of the opening.

17. The method of claim 16, wherein the steps of forming the first amorphous carbon layer and forming the first graphene layer are performed simultaneously.

18. The method of claim 16, wherein the first dielectric layer comprises a material selected from a group consisting essentially of oxide, $SiO_2$, borophosphosilicate glass (BPSG), TEOS, spin-on glass (SOG), undoped silicate glass (USG), fluorinated silicate glass (FSG), high-density plasma (HDP) oxide, or plasma-enhanced TEOS (PETEOS).

19. The method of claim 16, further comprising:
forming a conductive via in the opening, the first amorphous carbon layer and the first graphene layer lining the conductive via;
forming a second amorphous carbon layer over surfaces of the first amorphous carbon layer and the first dielectric layer facing away from the metal layer; and
forming a second graphene layer over a surface of the conductive via facing away from the metal layer.

20. The method of claim 16, wherein forming the first graphene layer comprises at least one of a chemical reduction of graphite oxide, an annealing of single-crystal SiC, or a chemical vapor deposition (CVD) process.

* * * * *